(12) United States Patent
Lim et al.

(10) Patent No.: US 8,928,015 B2
(45) Date of Patent: Jan. 6, 2015

(54) SEMICONDUCTOR LIGHT EMITTING DEVICE

(71) Applicant: LG Innotek Co., Ltd., Seoul (KR)

(72) Inventors: Woo Sik Lim, Gwangju (KR); Sung Ho Choo, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/090,906

(22) Filed: Nov. 26, 2013

(65) Prior Publication Data

US 2014/0077252 A1  Mar. 20, 2014

Related U.S. Application Data

(63) Continuation of application No. 12/646,908, filed on Dec. 23, 2009, now Pat. No. 8,653,545.

(30) Foreign Application Priority Data

Dec. 24, 2008  (KR) .......................... 10-2008-0133395

(51) Int. Cl.
*H01L 33/38* (2010.01)
*H01L 33/44* (2010.01)
*H01L 33/20* (2010.01)

(52) U.S. Cl.
CPC ............. *H01L 33/382* (2013.01); *H01L 33/38* (2013.01); *H01L 33/44* (2013.01); *H01L 33/20* (2013.01)
USPC ......................... 257/94; 257/99; 257/E33.066

(58) Field of Classification Search
CPC ............................. H01L 33/38; H01L 33/382
USPC ........................................ 257/94, 99, E33.066
See application file for complete search history.

(56) References Cited

U.S. PATENT DOCUMENTS

| 6,583,443 B1 | 6/2003 | Chang et al. |
| 6,650,018 B1 * | 11/2003 | Zhao et al. ..................... 257/775 |
| 6,717,182 B1 | 4/2004 | Tagami et al. |
| 7,019,330 B2 * | 3/2006 | Ludowise ......................... 257/79 |
| 7,268,371 B2 * | 9/2007 | Krames et al. ................... 257/98 |

(Continued)

FOREIGN PATENT DOCUMENTS

| CN | 101150165 A | 3/2008 |
| DE | 102007022947 A1 | 10/2008 |

(Continued)

*Primary Examiner* — Ermias Woldegeorgis
(74) *Attorney, Agent, or Firm* — Birch, Stewart, Kolasch & Birch, LLP

(57) ABSTRACT

A light emitting device including a first conductive type semiconductor layer, an active layer on the first conductive type semiconductor layer, a second conductive type semiconductor layer on the active layer, an electrode layer on the second conductive type semiconductor layer, a first electrode on the first conductive type semiconductor layer, and a second electrode on the second conductive type semiconductor layer and in an opening, the opening being in the electrode layer, wherein the second electrode has a first portion in the opening and a second portion extending from the first portion and overlapping at least a portion of the first electrode.

17 Claims, 18 Drawing Sheets

(56) References Cited

U.S. PATENT DOCUMENTS

| | | | |
|---|---|---|---|
| 7,351,599 B2 * | 4/2008 | Shen et al. | 438/26 |
| 7,375,380 B2 | 5/2008 | Asahara et al. | |
| 7,482,638 B2 * | 1/2009 | Wall, Jr. | 257/99 |
| 7,554,126 B2 | 6/2009 | Higashi et al. | |
| 8,076,688 B2 | 12/2011 | Kim et al. | |
| 8,330,179 B2 | 12/2012 | Kususe et al. | |
| 8,368,100 B2 * | 2/2013 | Donofrio et al. | 257/98 |
| 2006/0157718 A1 | 7/2006 | Seo et al. | |
| 2006/0220043 A1 | 10/2006 | Kim et al. | |
| 2006/0231852 A1 | 10/2006 | Kususe et al. | |
| 2007/0012930 A1 | 1/2007 | Liu et al. | |
| 2007/0131947 A1 | 6/2007 | Han | |
| 2007/0228388 A1 * | 10/2007 | Ko et al. | 257/79 |
| 2007/0262338 A1 | 11/2007 | Higashi et al. | |
| 2007/0284593 A1 * | 12/2007 | Ko et al. | 257/79 |
| 2008/0048194 A1 | 2/2008 | Kudo et al. | |
| 2008/0128721 A1 | 6/2008 | Watanabe et al. | |
| 2008/0145961 A1 | 6/2008 | Horio et al. | |
| 2008/0272420 A1 | 11/2008 | Lee | |
| 2009/0039359 A1 | 2/2009 | Voon et al. | |
| 2009/0140280 A1 * | 6/2009 | Shen et al. | 257/98 |
| 2009/0159909 A1 * | 6/2009 | Lee et al. | 257/96 |
| 2009/0242913 A1 | 10/2009 | Kim et al. | |
| 2010/0171135 A1 | 7/2010 | Engl et al. | |

FOREIGN PATENT DOCUMENTS

| | | |
|---|---|---|
| EP | 1953838 A2 | 8/2008 |
| JP | 05-145119 A | 6/1993 |
| JP | 6-237012 A | 8/1994 |
| JP | 7-94782 A | 4/1995 |
| JP | 2003-023182 A | 1/2003 |
| JP | 2004-071644 A | 3/2004 |
| JP | 2005-11857 A | 1/2005 |
| JP | 2006-148087 A | 6/2006 |
| JP | 2006-351918 A | 12/2006 |
| JP | 2007-288097 A | 11/2007 |
| KR | 10-2001-0072325 A | 7/2001 |
| KR | 10-2006-0064460 A | 6/2006 |
| KR | 10-2006-0067375 A | 6/2006 |
| KR | 10-2006-0118861 A | 11/2006 |
| KR | 10-2008-0035472 A | 4/2008 |
| KR | 10-2008-0082101 A | 9/2008 |
| WO | WO 2005/122290 A1 | 12/2005 |
| WO | WO 2006/035664 A1 | 4/2006 |
| WO | WO 2008/038842 A1 | 4/2008 |
| WO | WO 2008/131735 A1 | 11/2008 |
| WO | WO 2009/039805 A1 | 4/2009 |

* cited by examiner (A)

(B)

SEMICONDUCTOR LIGHT EMITTING DEVICE

CROSS-REFERENCE TO RELATED APPLICATIONS

The present application is a continuation of U.S. application Ser. No. 12/646,908, filed Dec. 23, 2009, which claims priority under 35 U.S.C. 119 and 35 U.S.C. 365 to Korean Patent Application No. 10-2008-0133395 (filed on Dec. 24, 2008), which are hereby incorporated by reference in their entirety.

BACKGROUND OF THE INVENTION

The present disclosure relates to a semiconductor light emitting device.

Group III-V nitride semiconductors have been in the spotlight as a core material for light emitting devices, such as light emitting diodes (LEDs), laser diodes (LDs), and the like, because of their excellent physical and chemical properties. Group III-V nitride semiconductors are composed of a semiconductor material having the chemical formula of $In_xAl_yGa_{1-x-y}N$ (where $0 \leq x \leq 1$, $0 \leq y \leq 1$, $0 \leq x+y \leq 1$).

LEDs are a kind of semiconductor device that converts electricity into infrared rays or light by using the characteristics of a compound semiconductor to transmit and receive a signal, and they are used as light sources.

LEDs or LDs made of nitride semiconductor materials are widely adopted in light emitting devices for obtaining light, and are applied as light sources for various products, for example, a light emission part for a keypad of a mobile phone, an electrical sign board, and a lighting device.

SUMMARY OF THE INVENTION

Embodiments provide a semiconductor light emitting device including an electrode structure.

Embodiments provide a semiconductor light emitting device including a first electrode having at least one branch on a first conductive type semiconductor layer.

Embodiments provide a semiconductor light emitting device including a first electrode and a second electrode, parts of patterns of which overlap each other or are disposed alternately with each other.

An embodiment provides a semiconductor light emitting device, including: a first conductive type semiconductor layer; a first electrode on a first portion of the first conductive type semiconductor layer and having at least one branch; an insulating layer covering the first electrode; and an electrode layer having a first portion directly on the insulating layer, the electrode layer having a second portion above a second portion of the first conductive type semiconductor different from the first portion of the first conductive type semiconductor layer.

An embodiment provides a semiconductor light emitting device, including: a first conductive type semiconductor layer; a first electrode on a first portion of the first conductive type semiconductor layer and having at least one branch; an insulating layer covering the first electrode; an electrode layer on the insulating layer; an opening in the insulating layer and the electrode layer arranged to expose a portion of the first electrode; and a first electrode pad formed in the opening and on the exposed portion of the first electrode.

An embodiment provides a semiconductor light emitting device, including: a first conductive type semiconductor layer; a first electrode on a first portion of the first conductive type semiconductor layer and having at least one branch; an insulating layer covering the first electrode; an electrode layer on the insulating layer; an active layer on the first conductive type semiconductor layer; a second conductive type semiconductor layer between the active layer and the electrode layer; a second electrode pad electrically connected to at least one of the electrode layer and the second conductive type semiconductor layer; and a second electrode on the electrode layer and having at least one branch.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In describing embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'.

Figure 1:
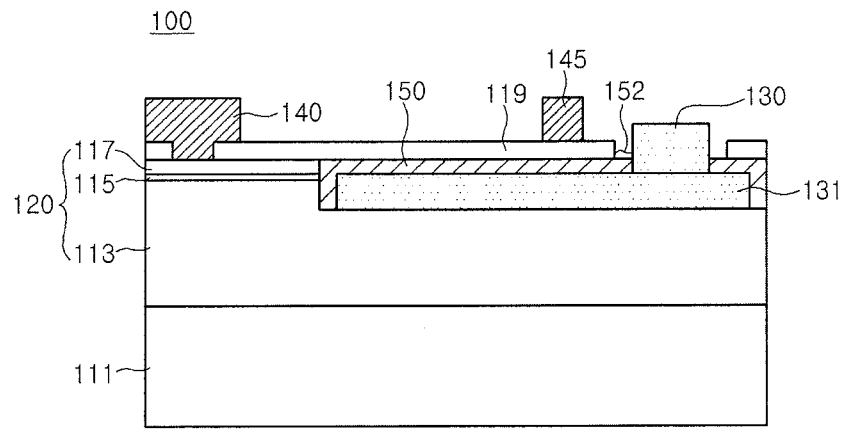
FIG. 1 is a cross-sectional view illustrating a semiconductor light emitting device according to an embodiment.

FIG. 1 is a cross-sectional view illustrating a semiconductor light emitting device 100 according to an embodiment.

Referring to FIG. 1, the semiconductor light emitting device 100 includes a substrate 111, a first conductive type semiconductor layer 113, an active layer 115, a second conductive type semiconductor layer 117, and a transparent electrode layer 119, first electrode parts 130 and 131, second electrode parts 140 and 145, and an insulating layer 150.

The semiconductor light emitting device 100 may include a light emitting diode (LED) formed of compound semiconductor, e.g., of group III-V elements. The LED may be a colored LED emitting blue, green or red light, or a UV LED, but the LED is not limited thereto.

The substrate 111 may include at least one of sapphire ($Al_2O_3$), SiC, Si, GaAs, GaN, ZnO, GaP, InP, and Ge, and have a conductive property and an insulating property. A concave-convex pattern (not shown) may be disposed on at least one of the upper and lower sides of the substrate 111, and have one of a stripe shape, a lens shape, a column shape, and a projection shape.

At least one of a buffer layer and an undoped semiconductor layer may be disposed on the substrate 111. The buffer layer may reduce a lattice mismatch between a GaN material and a substrate material, and include at least one of GaN, InN, AlN, InGaN, AlGaN, InAlGaN, and AlInN. The undoped semiconductor layer may be formed on the substrate 111 or the buffer layer, and include an undoped GaN-based semiconductor.

The first conductive type semiconductor layer 113 is disposed on the substrate 111, and includes at least one semiconductor layer doped with a first conductive type dopant, and a first electrode contact layer. For example, when the first conductive type semiconductor layer 113 is an N type semiconductor layer, the first conductive type semiconductor layer 113 may be formed of at least one of GaN, InN, AlN, InGaN, AlGaN, InAlGaN, and AlInN. When the first conductive type dopant is an N type dopant, the first conductive type dopant may selectively include Si, Ge, Sn, Se, and Te.

The active layer 115 is disposed on the first conductive type semiconductor layer 113. The active layer 115 may have a single quantum well structure or a multiple quantum well (MQW) structure. For example, the active layer 115 may include one of an InGaN well layer/GaN barrier layer, a GaN well layer/AlGaN barrier layer, and an InGaN well layer/InGaN barrier layer. The active layer 115 includes a material having band gap energy according to the wavelength of emitted light. For example, when blue light having a wavelength ranging from about 460 to 470 nm is emitted, the active layer 115 may have a single or multiple quantum well structure including an InGaN well layer/GaN barrier layer as a single periodic structure. The active layer 115 may selectively include a material emitting colored light such as light of a blue wavelength, light of a red wavelength, and light of a green wavelength, but the present disclosure is not limited thereto.

A first conductive type clad layer (not shown) may be disposed between the first conductive type semiconductor layer 113 and the active layer 115. When the first conductive type clad layer is an N type semiconductor layer, the first conductive type clad layer may be an N type AlGaN layer, but the present disclosure is not limited thereto.

The second conductive type semiconductor layer 117 is at least one semiconductor layer doped with a second conductive type dopant, and includes a second electrode contact layer. When the second conductive type semiconductor layer 117 is a P type semiconductor layer, the second conductive type semiconductor layer 117 may be formed of at least one of GaN, InN, AlN, InGaN, AlGaN, InAlGaN, and AlInN. When the second conductive type dopant is a P type dopant, at least one of Mg, Zn, Ca, Sr, and Ba may be added to the second conductive type dopant.

A third conductive type semiconductor layer (not shown) may be disposed on the second conductive type semiconductor layer 117. The third conductive type semiconductor layer may be a semiconductor layer having the opposite polarity to that of the second conductive type semiconductor layer 117, e.g., be formed of compound semiconductor such as GaN, InN, InGaN, AlGaN, InAlGaN, or AlInN. For example, when the third conductive type semiconductor layer is an N type semiconductor layer, the third conductive type semiconductor layer may be formed of at least one of GaN, InN, AlN, InGaN, AlGaN, InAlGaN, and AlInN. When the first conductive type dopant is an N type dopant, the first conductive type dopant may selectively include Si, Ge, Sn, Se, and Te.

A light emitting structure 120 may include the first conductive type semiconductor layer 113, the active layer 115, and the second conductive type semiconductor layer 117, or may further include the third conductive type semiconductor layer. The light emitting structure 120 may have one of an N—P junction structure, a P—N junction structure, an N—P—N junction structure, and a P—N—P junction structure.

The transparent electrode layer 119 may be disposed on the second conductive type semiconductor layer 117 or the third conductive type semiconductor layer. The transparent electrode layer 119 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), ZnO, RuOx, TiOx, IrOx, and $SnO_2$, but the present disclosure is not limited thereto.

The first electrode parts 130 and 131 include a first electrode (also denoted by 131), and a first electrode pad (also denoted by 130). The first electrode 131 is disposed on the first conductive type semiconductor layer 113. The first electrode pad 130 may be a portion of the first electrode 131, or discretely disposed on the first electrode 131. The first electrode 131 may be formed in a predetermined pattern on a region exposing the first conductive type semiconductor layer 113.

For example, the pattern of the first electrode 131 may have at least one of a straight line shape, a curve shape, a combination of a straight line shape and a curve shape, a fork shape branched from a single pattern, a polygonal shape, a lattice shape, a dot shape, a diamond shape, a parallelogram shape, a mesh shape, a stripe shape, a cross shape, a radial shape, a circular shape, and a combination thereof, but the present disclosure is not limited thereto. The first electrode 131 having the pattern uniformly supplies power to the first conductive type semiconductor layer 113, so as to prevent a current from being concentrated on a region.

The first electrode pad 130 is disposed on a portion of the first electrode 131, and may be provided in plurality. In this case, the first electrode pads 130 are spaced apart from each other, and connected to each other through the first electrode 131. The first electrode pad 130 may be integrally formed with the first electrode 131. In this case, an exposed portion of the first electrode 131 may be used as the first electrode pad 130.

The first electrode pad 130 may be disposed at a position for efficiently receiving power through the first electrode 131, e.g., at a center or edge of the first electrode 131.

The active layer 115 and the second conductive type semiconductor layer 117 may be removed from the first electrode 131.

The first electrode 131 and the first electrode pad 130 may be formed in at least one layer with at least one of Ti, Al, In, Ta, Pd, Co, Ni, Si, Ge, Ag, Rh, Au, Ir, Pt, W, Au, and a combination thereof, but the material thereof is not limited thereto.

The insulating layer 150 is disposed at the periphery of the first electrode 131, and prevents the first electrode 131 from contacting the active layer 115 and the second conductive type semiconductor layer 117. A portion of the insulating layer 150 is exposed, and the first electrode 131 is exposed through the exposed portion, so that the first electrode pad 130 can be formed on the first electrode 131. The insulating layer 150 is formed of a light transmitting dielectric or insulating material such as $SiO_2$, $Si_3N_4$, $Al_2O_3$, or $TiO_2$, but the present disclosure is not limited thereto.

The first electrode pad 130 may protrude through a first opening 152 of the transparent electrode layer 119.

The transparent electrode layer 119 may be disposed on the second conductive type semiconductor layer 117 and the insulating layer 150. The transparent electrode layer 119 is electrically and physically spaced apart from the first electrode pad 130 or the first electrode 131.

The second electrode parts 140 and 145 may be disposed on the transparent electrode layer 119. The second electrode parts 140 and 145 include a second electrode 140, and a second electrode pad 145, which are electrically connected to each other.

The second electrode pad 140 and/or the second electrode 145 may be disposed on the second conductive type semiconductor layer 117.

The second electrode pad 140 may be disposed on the transparent electrode layer 119 or the second conductive type semiconductor layer 117. The second electrode pad 140 may be in direct contact with the second conductive type semiconductor layer 117, or connected to the second conductive type semiconductor layer 117 through the transparent electrode layer 119. The second electrode pad 140 may be electrically connected to the transparent electrode layer 119 and the second conductive type semiconductor layer 117.

The second electrode 145 branched from the second electrode pad 140 may be formed in a predetermined pattern. For example, the pattern of the second electrode 145 may have at least one of a straight line shape, a curve shape, a combination of a straight line shape and a curve shape, a fork shape branched from a single pattern, a polygonal shape, a lattice shape, a dot shape, a diamond shape, a parallelogram shape, a mesh shape, a stripe shape, a cross shape, a radial shape, a circular shape, and a combination thereof, but the present disclosure is not limited thereto. The second electrode 145 having the pattern uniformly supplies power to the second conductive type semiconductor layer 117, so as to prevent a current from being concentrated on a region.

The second electrode pad 140 may be provided in plurality. The second electrode pad 140 and the second electrode 145 may be formed in at least one layer with, e.g., at least one of Ag, Ag alloy, Ni, Al, Al alloy, Rh, Pd, Ir, Ru, Mg, Zn, Pt, Au, Hf, and a combination thereof, but the present disclosure is not limited thereto.

A portion of the second electrode 145 may overlap the first electrode 131. That is, a portion of the pattern of the second electrode 145 may spatially overlap the first electrode 131. A partial overlap structure of the first electrode 131 and the second electrode 145 improves a light emitting area.

A portion of the pattern of the second electrode 145 and a portion of the pattern of the first electrode 131 may spatially overlap each other with the insulating layer 150 therebetween. The shapes of the overlapped patterns of the first electrode 131 and the second electrode 145 may be varied.

The pattern of the first electrode 131 and the pattern of the second electrode 145 supply uniform power to the entire region of the first conductive type semiconductor layer 113 and the entire region of the second conductive type semiconductor layer 117, thus improving light emitting efficiency.

Figure 2:
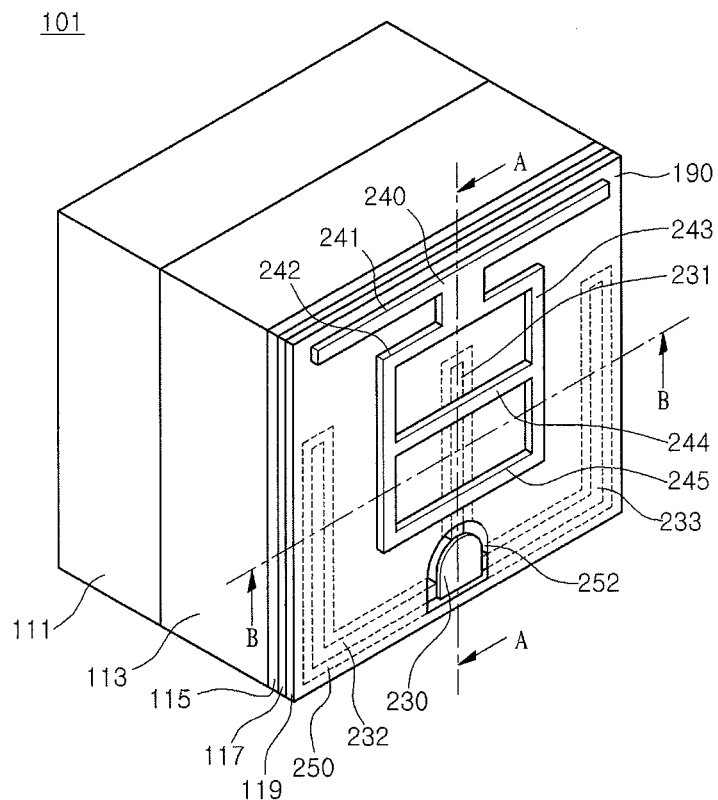
FIG. 2 is a perspective view illustrating a semiconductor light emitting device according to an embodiment.
Figure 3:
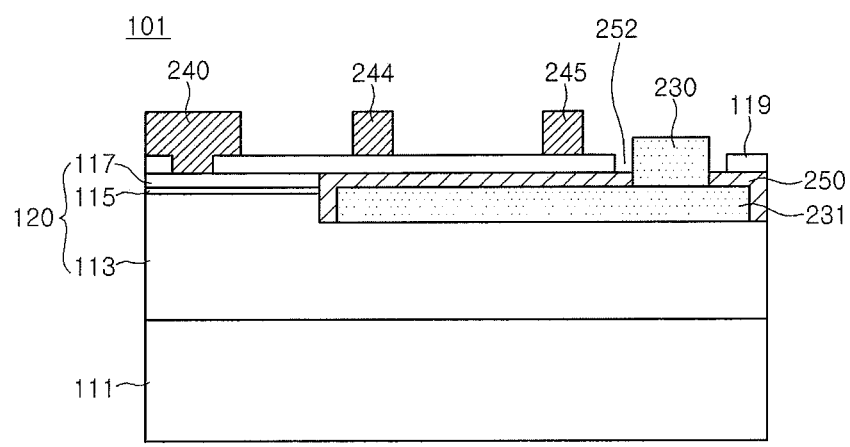
FIG. 3 is a cross-sectional view taken along line A-A of FIG. 2.
Figure 4:
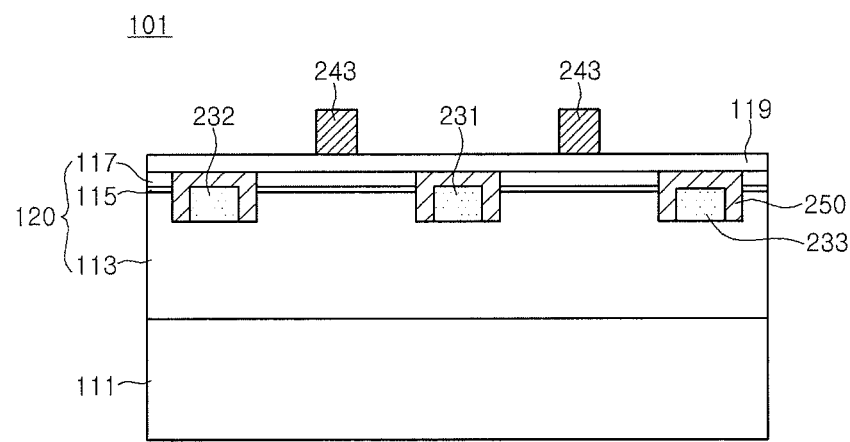
FIG. 4 is a cross-sectional view taken along line B-B of FIG. 2.

FIG. 2 is a perspective view illustrating a semiconductor light emitting device 101 according to an embodiment. FIG. 3 is a cross-sectional view taken along line A-A of FIG. 2. FIG. 4 is a cross-sectional view taken along line B-B of FIG. 2. Since the current embodiment is partially the same as the above embodiment, a description thereof will be omitted.

Referring to FIGS. 2 to 4, the semiconductor light emitting device 101 includes the substrate 111, the first conductive type semiconductor layer 113, the active layer 115, the second conductive type semiconductor layer 117, and the transparent electrode layer 119, first electrode parts 230 231, 232, and 233, second electrode parts 240, 241, 242, 243, 244, and 245, and a insulating layer 250.

The first electrode parts 230, 231, 232, and 233 may be classified into a first electrode pad (also denoted by 230) and first electrodes (also denoted by 231, 232, and 233). The first electrode pad 230 is disposed in a first opening 252 disposed in the middle of a side of a chip. The first electrodes 231, 232, and 233 may have shapes branched from the first electrode pad 230, e.g. be N branches (N>2). A part of the first electrodes 231, 232, and 233, e.g. the first electrodes 232 and 233 disposed on both sides may be patterns bent at predetermined angles or patterns extending along a boundary of the chip. The first electrode 231 may extend to a region close to a second electrode pad (also denoted by 240) along a center line of the chip.

The insulating layer 250 is disposed around the first electrodes 231, 232, and 233. The first opening 252 is disposed in the insulating layer 250 and a side of the transparent electrode layer 119. The first electrode pad 230 is exposed through the first opening 252.

The second electrode parts 240, 241, 242, 243, 244, and 245 may be classified into a second electrode pad (also denoted by 240) and second electrodes (also denoted by 241, 242, 243, 244, and 245). The second electrode pad 240 may be disposed in the middle of a side of the chip, or spaced a predetermined distance from the first electrode pad 230. The second electrodes 241, 242, 243, 244, and 245 have shapes branched from the second electrode pad 240, a character shape, a shape with at least one bent portion, a radial shape, or a shape with branches, but the present disclosure is not limited thereto.

In other words, the second electrodes 241, 242, and 243 may have shapes branched along predetermined directions from the second electrode pad 240, e.g., may have four branches. A side electrode (also denoted by 241) is branched along a boundary of the chip. The second electrodes 242 and 243 are branched from the inside of the second electrode pad 240 to both sides thereof and bent, and bent portions of the second electrodes 242 and 243 are connected through the second electrodes 244 and 245 (also referred to as connecting electrodes).

The second electrodes 244 and 245 may partially overlap the first electrode 231, thus improving a light emitting area. Further, a current is dispersed to the entire regions respectively of the layers to improve light emitting efficiency.

The first electrode pad 230 and the second electrode pad 240 may be selectively disposed at corners of the chip, the centers of boundaries of side surfaces constituting the chip, or regions spaced apart from the centers. A pattern of the first electrodes 231, 232, and 233, and a pattern of the second electrodes 241, 242, 243, 244, and 245 may be the same or be different from each other.

Figure 5:
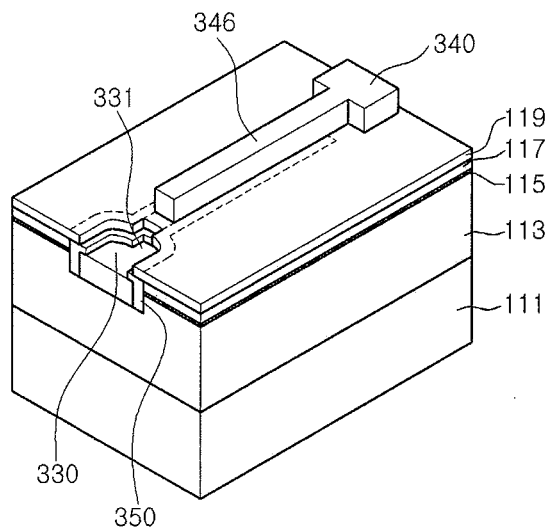
FIG. 5 is a perspective view illustrating a semiconductor light emitting device according to another embodiment.
Figure 6:
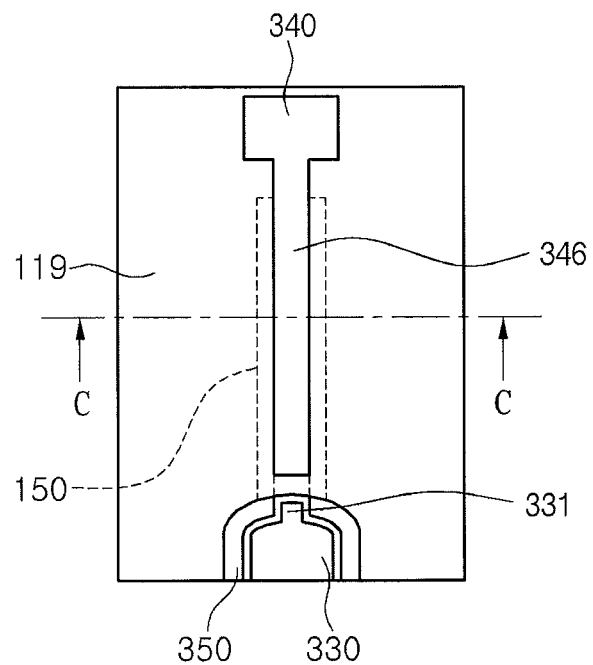
FIG. 6 is a plan view of FIG. 5.
Figure 7:
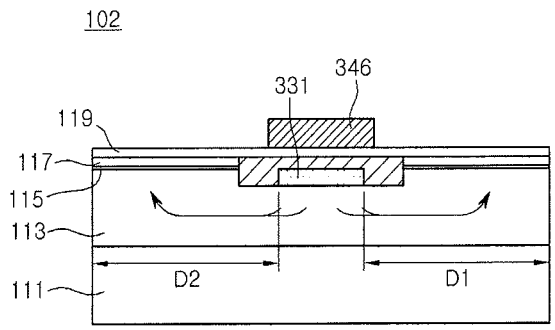
FIG. 7 is a cross-sectional view taken along line C-C of FIG. 6.

FIG. 5 is a perspective view illustrating a semiconductor light emitting device 102 according to an embodiment. FIG. 6 is a plan view of FIG. 5. FIG. 7 is a cross-sectional view taken along line C-C of FIG. 6. Since the current embodiment is partially the same as the above embodiments, a description thereof will be omitted.

Referring to FIGS. 5 and 6, the semiconductor light emitting device 102 includes a first electrode 331 and a second electrode 346. A pattern of the first electrode 331 and a pattern of the second electrode 346 are different from those of the above embodiment.

The first electrode 331 extends from a first side of a chip to a second side of the chip, and the second electrode 346 extends from the second side of the chip to the first side of the chip. The first electrode 331 and the second electrode 346 overlap each other in the inner region of the chip.

A first portion of the first electrode 331 is exposed, and the exposed first portion is used as a first electrode pad 330. That is, a portion of the first electrode 331 is used as the first electrode pad 330 without using a divided first electrode pad.

A portion of the second electrode 346 is used as a second electrode pad 340.

A line width of the first electrode 331 may be the same as, or different from a line width of the second electrode 346.

A part of patterns of the first electrode 331 and a part of patterns of the second electrode 346 spatially overlap each other on/under the transparent electrode layer 119 and an insulating layer 350.

Referring to FIG. 7, a current applied to the first electrode pad 330 is supplied to the first conductive type semiconductor layer 113 through the first electrode pad 330 and the first electrode 331. A current applied to the second electrode pad 340 is dispersed through the second electrode 346 and the transparent electrode layer 119, and uniformly supplied to the second conductive type semiconductor layer 117. Accordingly, currents supplied through the first electrode 331 and the second electrode 346 are supplied to the entire region of the active layer 115, so as to improve light emitting efficiency and obtain a device having high reliability and efficiency.

Since current moving distances D1 and D2 of the first electrode 331 and the second electrode 346 are close to the center of the chip and the periphery of the chip, uniform currents are supplied to the entire region of the chip. The current moving distance D1 of the first electrode 331 may be equal to the current moving distance D2 of the second electrode 346, so as to provide uniform current distribution.

Figure 8:
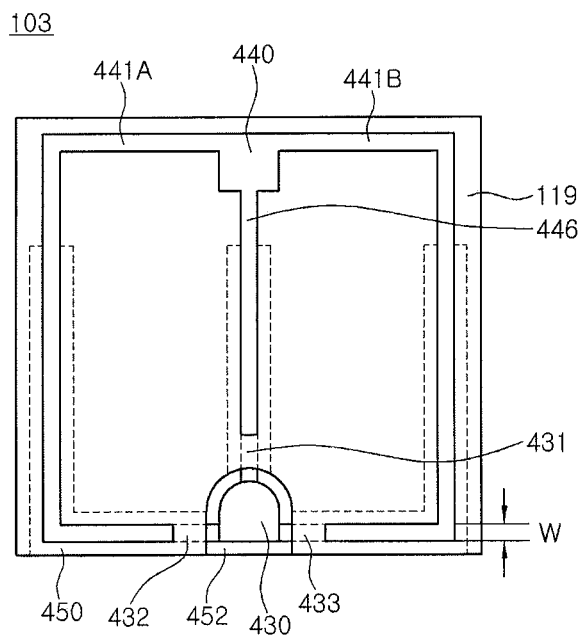
FIG. 8 is a plan view illustrating a semiconductor light emitting device according to an embodiment.

FIG. 8 is a plan view illustrating a semiconductor light emitting device 103 according to an embodiment. Since the current embodiment is partially the same as the above embodiments, a description thereof will be omitted.

Referring to FIG. 8, the semiconductor light emitting device 103 includes first electrodes 431, 432, and 433, and second electrodes 441A, 441B, and 446. Patterns of the first electrodes 431, 432, and 433 partially overlap patterns of the second electrodes 441A, 441B, and 446.

The first electrodes 431, 432, and 433 are formed in at least three branches branched from a first electrode pad 430, and disposed on the first conductive type semiconductor layer 113 of FIG. 1. The second electrodes 441A, 441B, and 446 are formed in at least three branches branched from a second electrode pad 440.

As illustrated in FIG. 8, the first electrode pad 430 is disposed on a side of the middle of a chip, and the first electrodes 431, 432, and 433 extend at the center and both boundaries of the chip from the first electrode pad 430.

The second electrodes 441A, 441B, and 446 partially overlap the upper portions of the first electrodes 431, 432, and 433. For example, the first electrode 431 and the second electrode 446 spatially overlap each other in the center of the chip, and the second electrode 441A spatially overlap the first electrode 432 at one boundary of the chip, and the second electrode 441B spatially overlap the first electrode 433 at another boundary of the chip. The first electrodes 431, 432, and 433 may be the same as or different from the second electrodes 441A, 441B, and 446 in a line width W.

FIGS. 9 to 16 are schematic views illustrating a method of manufacturing the semiconductor light emitting device 103.

Figure 9:
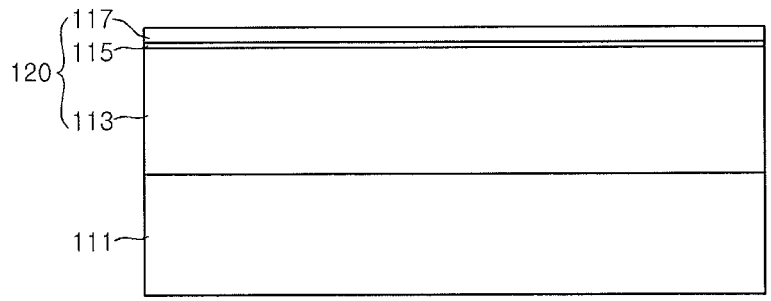
FIGS. 9 to 16 are schematic views illustrating a method of manufacturing a semiconductor light emitting device according to an embodiment.

Referring to FIG. 9, the substrate 111 is loaded in a chamber, and a plurality of compound semiconductor layers may be formed on the substrate 111. The compound semiconductor layers may include compound semiconductor of group II to VI elements.

Compound semiconductor is grown on the substrate 111. Apparatus growing the compound semiconductor may be one of apparatuses performing electron beam deposition, physical vapor deposition (PVD), chemical vapor deposition (CVD), plasma laser deposition (PLD), sputtering, and metal organic chemical vapor deposition (MOCVD), or a dual-type thermal evaporator, but the present disclosure is not limited thereto.

The substrate 111 may include at least one of sapphire ($Al_2O_3$), SiC, Si, GaAs, GaN, ZnO, GaP, InP, and Ge, and have a concave-convex pattern.

At least one of a buffer layer and an undoped semiconductor layer may be formed on the substrate 111. The buffer layer may reduce a lattice mismatch between a GaN material and a substrate material, and include, e.g., at least one of GaN, InN, AlN, InGaN, AlGaN, InAlGaN, and AlInN. The undoped semiconductor layer may be formed on the substrate 111 or the buffer layer, and include an undoped GaN-based semiconductor. Hereinafter, the buffer layer and the undoped semiconductor layer are removed from a structure that will now be described in the current embodiment.

The first conductive type semiconductor layer 113, the active layer 115, and the second conductive type semiconductor layer 117 are sequentially formed on the substrate 111. Semiconductors thereof are compound semiconductors having the chemical formula of $In_xAl_yGa_{1-x-y}N$ (where $0 \leq x \leq 1$, $0 \leq y \leq 1$, $0 \leq x+y \leq 1$).

The first conductive type semiconductor layer 113 is formed on the substrate 111, and includes at least one semiconductor layer doped with a first conductive type dopant, and a first electrode contact layer. For example, when the first conductive type semiconductor layer 113 is an N type semiconductor layer, the first conductive type semiconductor layer 113 may be formed of at least one of GaN, InN, AlN, InGaN, AlGaN, InAlGaN, and AlInN. When the first conductive type dopant is an N type dopant, the first conductive type dopant may selectively include Si, Ge, Sn, Se, and Te.

The active layer 115 is formed on the first conductive type semiconductor layer 113. The active layer 115 may have a single quantum well structure or a multiple quantum well (MQW) structure. For example, the active layer 115 may include one of an InGaN well layer/GaN barrier layer, a GaN well layer/GaN barrier layer, and an InGaN well layer/InGaN barrier layer. The active layer 115 includes a material having band gap energy according to the wavelength of emitted light. For example, when blue light having a wavelength ranging from about 460 to 470 nm is emitted, the active layer 115 may have a single or multiple quantum well structure including an InGaN well layer/GaN barrier layer as a single periodic structure. The active layer 115 may selectively include a material emitting colored light such as light of a blue wavelength, light of a red wavelength, and light of a green wavelength, but the present disclosure is not limited thereto.

A first conductive type clad layer may be formed between the first conductive type semiconductor layer 113 and the active layer 115. The first conductive type clad layer may be formed of a GaN-based semiconductor, but the present disclosure is not limited thereto.

The second conductive type semiconductor layer 117 is at least one semiconductor layer doped with a second conductive type dopant, and includes a second electrode contact layer. When the second conductive type semiconductor layer 117 is a P type semiconductor layer, the second conductive type semiconductor layer 117 may be formed of at least one of GaN, InN, AlN, InGaN, AlGaN, InAlGaN, and AlInN. When the second conductive type dopant is a P type dopant, at least one of Mg, Zn, Ca, Sr, and Ba may be added to the second conductive type dopant.

A second conductive type clad layer may be formed between the second conductive type semiconductor layer 117 and the active layer 115, and formed of a GaN-based semiconductor, but the present disclosure is not limited thereto.

A third conductive type semiconductor layer may be formed on the second conductive type semiconductor layer 117. The third conductive type semiconductor layer may be formed of semiconductor doped with a first conductive type dopant, e.g., of compound semiconductor such as GaN, InN, AlN, InGaN, AlGaN, InAlGaN, or AlInN. When the first conductive type dopant is an N type dopant, the first conductive type dopant may selectively include Si, Ge, Sn, Se, and Te.

The light emitting structure 120 may include the first conductive type semiconductor layer 113, the active layer 115, and the second conductive type semiconductor layer 117, or may further include the third conductive type semiconductor layer. The light emitting structure 120 may have one of an N—P junction structure, a P—N junction structure, an N—P—N junction structure, and a P—N—P junction structure.

Figure 10:
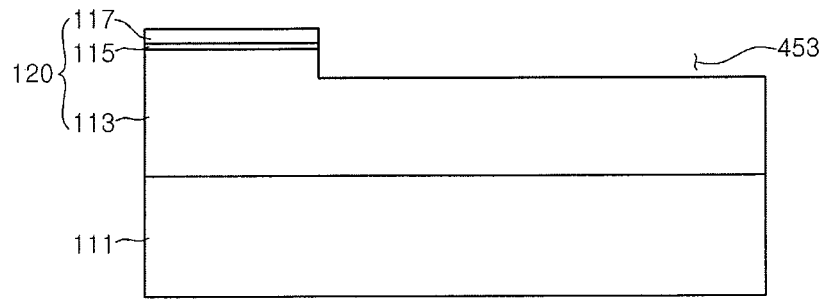
Figure 11:
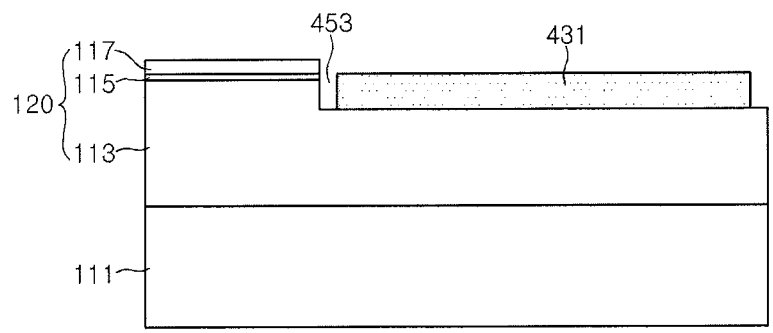

Referring to FIGS. 10 and 11, a portion of the first conductive type semiconductor layer 113 is exposed through an etch process. The exposed portion of the first conductive type semiconductor layer 113 is a second opening 453, which may have a structure corresponding to the aforementioned first electrode pattern.

The first electrode 431 is formed on the first conductive type semiconductor layer 113 exposed through the second opening 453. The first electrode 431 is spaced apart from the active layer 115 and the second conductive type semiconductor layer 117. Before the first electrode 431 is formed, the outsides of the active layer 115 and the second conductive type semiconductor layer 117 may be protected with a mask layer or an insulating layer.

The first electrode 131 may be formed in at least one layer with at least one of Ti, Al, In, Ta, Pd, Co, Ni, Si, Ge, Ag, Rh, Au, Ir, Pt, W, Au, and a combination thereof, but the material thereof is not limited thereto.

For example, a pattern shape of the first electrode 431 may be at least one of a straight line shape, a curve shape, a combination of a straight line shape and a curve shape, a fork shape branched from a single pattern, a polygonal shape, a lattice shape, a dot shape, a diamond shape, a parallelogram shape, a mesh shape, a stripe shape, a cross shape, a radial shape, a circular shape, and a combination thereof, but the present disclosure is not limited thereto. The first electrode 431 having the pattern uniformly supplies power to the first conductive type semiconductor layer 113, so as to prevent a current from being concentrated on a region.

Figure 12:
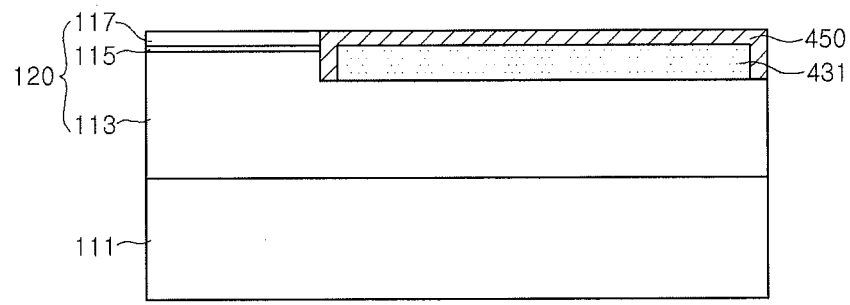
Figure 13:
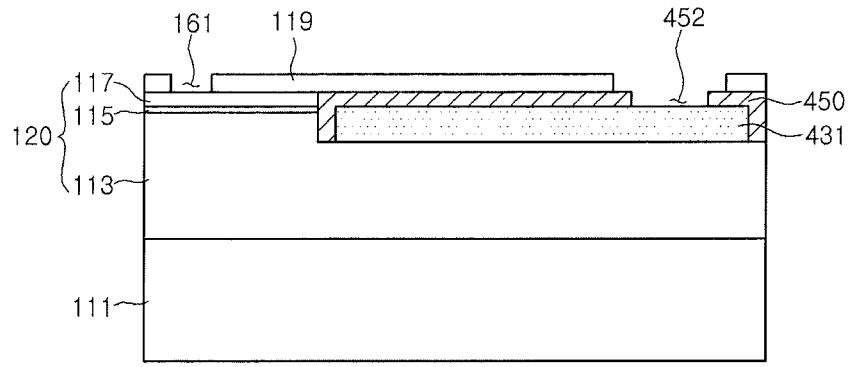

Referring to FIGS. 12 to 13, an insulating layer 450 is formed on the periphery of the first electrode 431. The insulating layer 450 prevents the first electrode 431 from electrically contacting the active layer 115 and the second conductive type semiconductor layer 117. The insulating layer 450 may be formed of an insulating material such as $SiO_2$, $Si_3N_4$, $Al_2O_3$, or $TiO_2$, but the present disclosure is not limited thereto.

The insulating layer 450 may have the same height as, or the greater or less height than that of the second conductive type semiconductor layer 117. An end of the insulating layer 450 may extend to the upper side of the second conductive type semiconductor layer 117 adjacent to the insulating layer 450.

Figure 14:
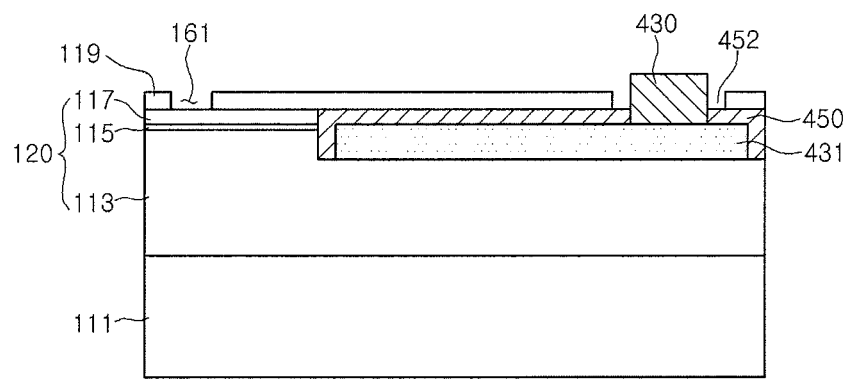

Referring to FIGS. 13 and 14, the transparent electrode layer 119 is formed on the second conductive type semiconductor layer 117 and the insulating layer 450. The transparent electrode layer 119 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), ZnO, RuOx, TiOx, IrOx, and $SnO_2$, but the present disclosure is not limited thereto. Alternatively, a reflective electrode layer of, e.g., Al, Ag, Pd, Rh, or Pt may be formed without the transparent electrode layer 119, which improves reflecting efficiency when a chip is mounted in a flip method.

The transparent electrode layer 119 may be provided with a first opening 452 and a third opening 161 that may be formed through a mask pattern or an etch process.

The first opening 452 is formed at sides of the transparent electrode layer 119 and the insulating layer 450 to expose a portion of the first electrode 431. The third opening 161 is formed at a side of the transparent electrode layer 119 to expose a portion of the second conductive type semiconductor layer 117. The third opening 161 may be omitted.

An upper diameter of the first opening 452 may be greater than a lower diameter thereof.

The first electrode pad 430 is formed on the first electrode 431 in the first opening 452. The first electrode pad 430 may selectively include materials of the first electrode 431.

Figure 15:
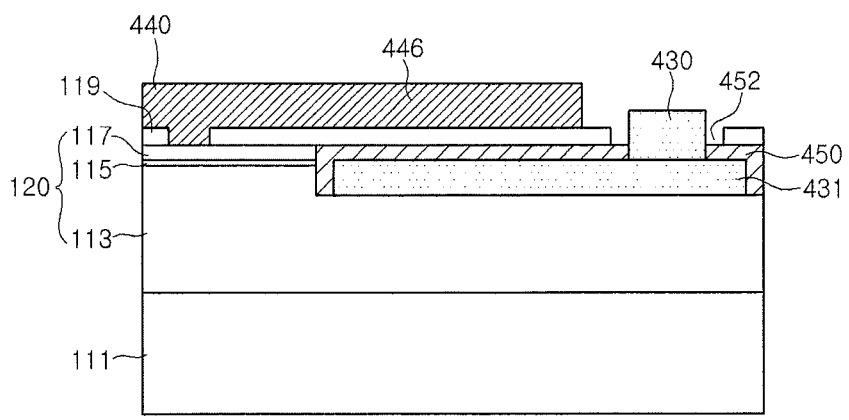

Referring to FIGS. 14 and 15, the second electrode pad 440 and the second electrode 446 are formed on the transparent electrode layer 119, and the second electrode pad 440 is electrically connected to the second conductive type semiconductor layer 117 through the third opening 161. The second electrode 446 disposed on the transparent electrode layer 119 spatially overlaps a predetermined region of the first electrode 431.

Figure 16:
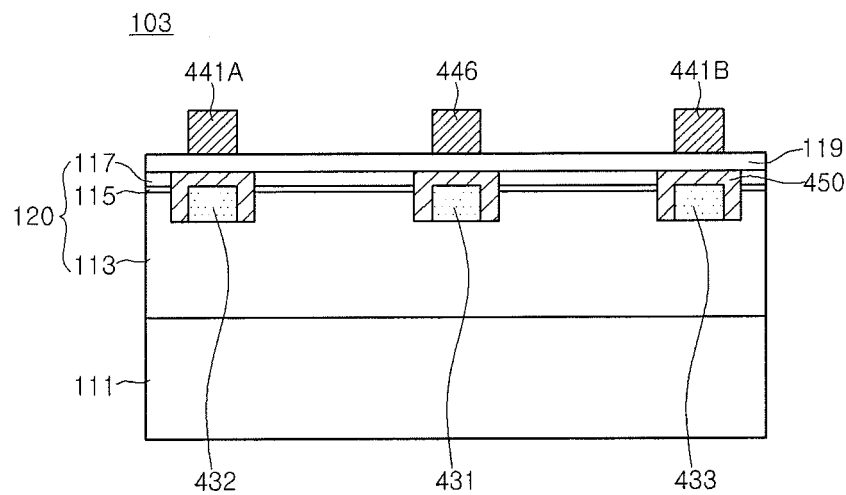

FIGS. 15 and 16 are vertical and horizontal cross-sectional views illustrating the semiconductor light emitting device 103 of FIG. 8.

Referring to FIGS. 15 and 16, the insulating layer 450 is disposed at the peripheries of the first electrodes 431, 432, and 433, and disposed between the first electrodes 431, 432, and 433, and other layers. The first electrodes 431, 432, and 433 may be formed in branch shapes on the first conductive type semiconductor layer 113, as illustrated in FIG. 8.

Figure 17:
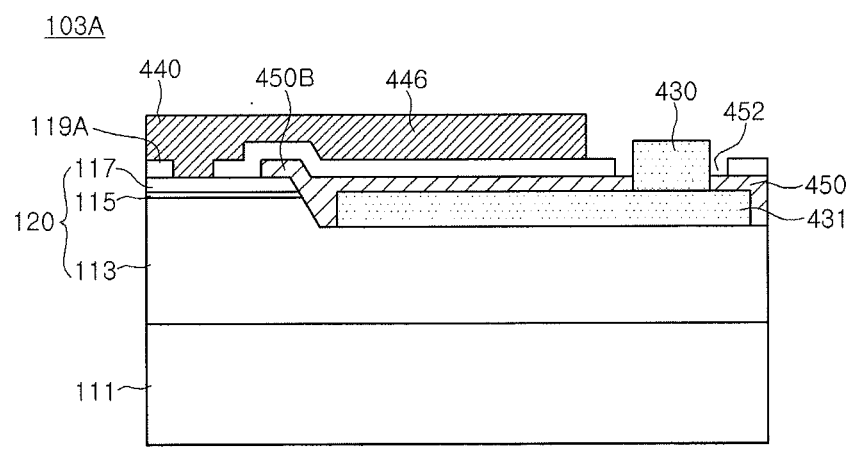
FIG. 17 is a cross-sectional view illustrating a semiconductor light emitting device according to another embodiment.

FIG. 17 is a cross-sectional view illustrating a semiconductor light emitting device 103A according to an embodiment. Since the current embodiment is partially the same as the embodiment of FIG. 8, a description thereof will be omitted, and like reference numerals denote like elements.

Referring to FIG. 17, when the semiconductor light emitting device 103A is mesa-etched, the peripheries of the second conductive type semiconductor layer 117, the active layer 115, and the first conductive type semiconductor layer 113 may have substantially vertical or inclined surfaces. After the first electrode 431 is formed, the insulating layer 450 may be formed. The insulating layer 450 is formed between the first electrode 431 and the semiconductor layers 113, 115, and 117. A portion 450B of the insulating layer 450 may extend on a portion of the upper surface of the second conductive type semiconductor layer 117 adjacent to the insulating layer 450. At least one of the transparent electrode layer 119 and the second electrode 446 stacked on the insulating layer 450 may have an uneven surface along the portion 450B of the insulating layer 450.

FIGS. 18 to 26 are schematic views illustrating a method of manufacturing a semiconductor light emitting device according to another embodiment. Since the current embodiment is partially the same as the above embodiments, a description thereof will be omitted.

Figure 18:
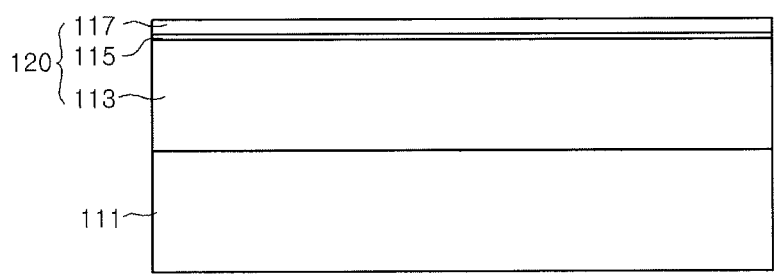
FIGS. 18 to 26 are schematic views illustrating a method of manufacturing a semiconductor light emitting device according to another embodiment.
Figure 19:
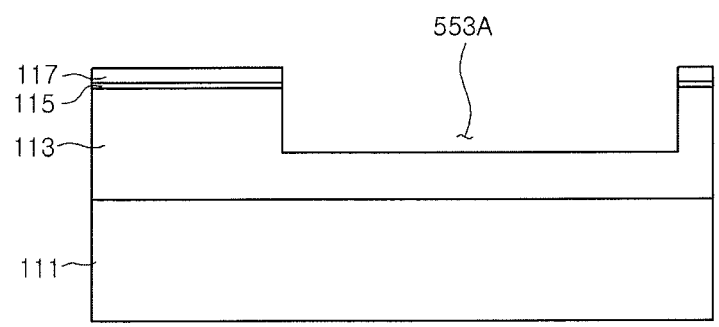

Referring to FIGS. 18 and 19, the first conductive type semiconductor layer 113, the active layer 115, and the second conductive type semiconductor layer 117 are sequentially formed on the substrate 111. The first conductive type semiconductor layer 113 may be an N type semiconductor layer, and the second conductive type semiconductor layer 117 may be a P-type semiconductor layer, and other semiconductor layers may be formed between the respective layers on the substrate 111, but the present disclosure is not limited thereto.

Figure 20:
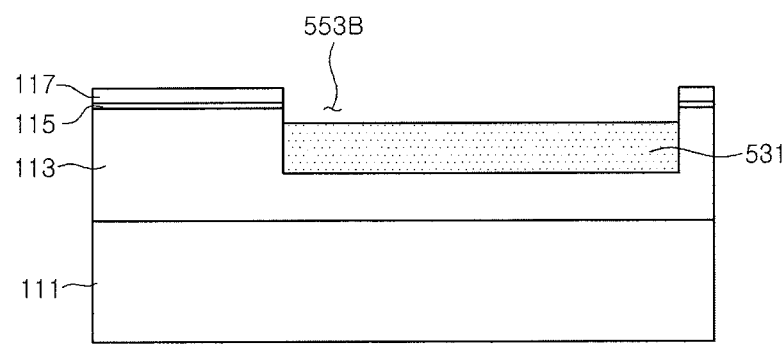

Referring to FIGS. 19 and 20, a fourth opening 553A is formed in the first conductive type semiconductor layer 113 through a first mesa etch process. The depth of the fourth opening 553A extending from the upper surface of the first conductive type semiconductor layer 113 is greater than the thickness of a first electrode. The fourth opening 553A has a pattern that may be formed in the shape of the first electrode pattern described in at least one of the above embodiments.

A first electrode 531 having a predetermined thickness may be formed in the fourth opening 553A. The first electrode 531 may be disposed below a line extending from the active layer 115. The lower and side surfaces of the first electrode 531 is in contact with the first conductive type semiconductor layer 113.

Figure 21:
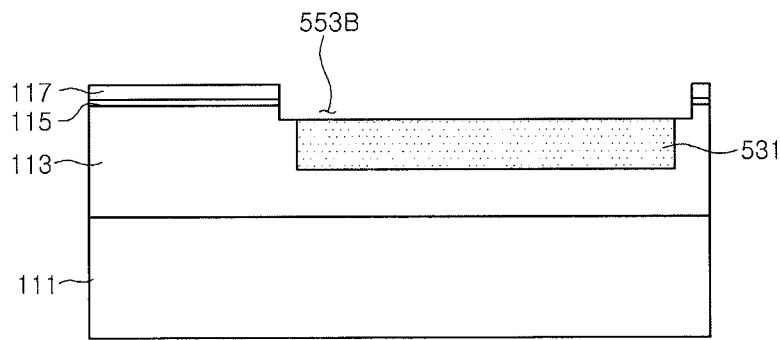
Figure 22:
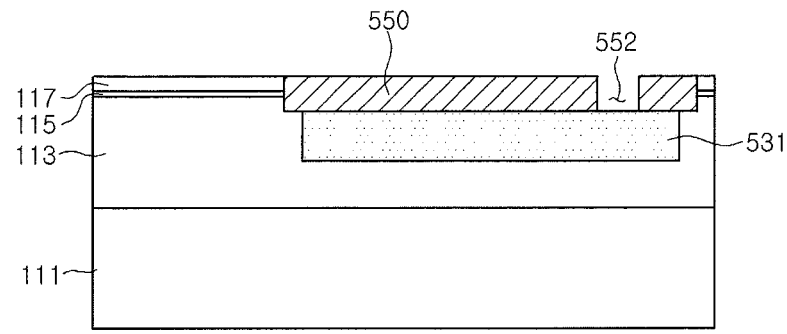

Referring to FIGS. 20 to 22, a fifth opening 553B is formed around the upper portion of the fourth opening 553A through a second mesa etch process, and may have a width that is equal to or greater than that of the fourth opening 553A. That is, the fifth opening 553B exposes the surrounding of the fourth opening 553A by etching the semiconductor layers 113, 115, and 117.

A insulating layer 550 is formed in the fifth opening 553B on the first electrode 531 to seal the first electrode 531.

A first opening 552 is formed in the insulating layer 550 by etching the insulating layer 550 or using a mask pattern, but the present disclosure is not limited thereto.

Figure 23:
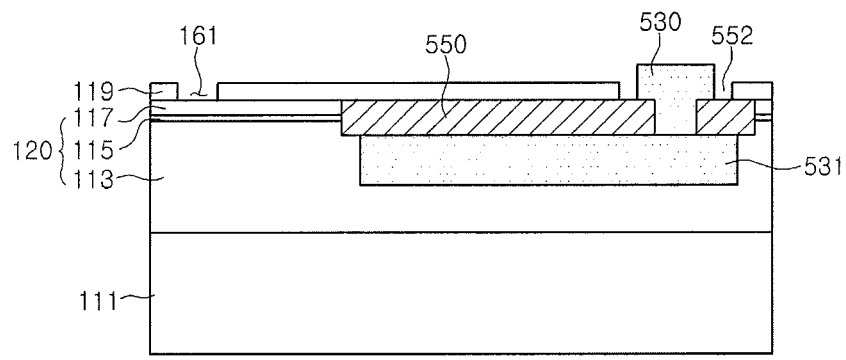
Figure 24:
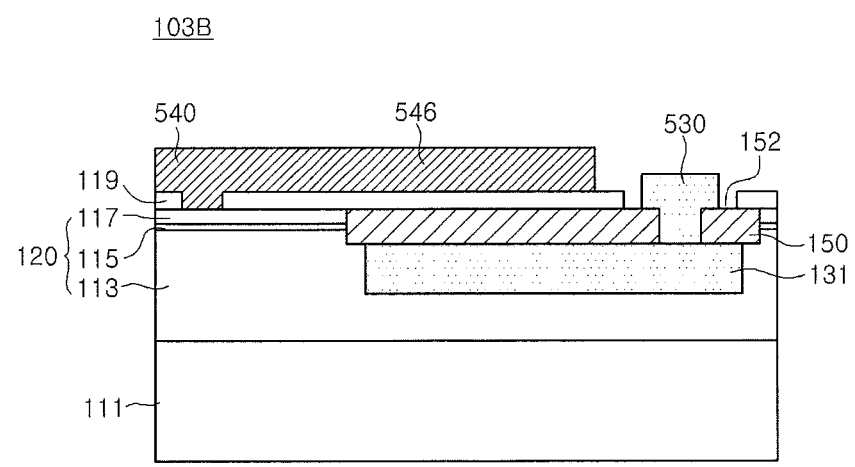

Referring to FIGS. 23 and 24, the transparent electrode layer 119 is formed on the second conductive type semiconductor layer 117 and the insulating layer 550. The first opening 552 is formed in the transparent electrode layer 119 to expose a side of the first electrode 531. The third opening 161 is formed in the transparent electrode layer 119 to expose a side of the second conductive type semiconductor layer 117.

A first electrode pad 530 is formed in the first opening 552, and may be in electrical contact with the first electrode 531.

A second electrode 546 and a second electrode pad 540 are formed on the transparent electrode layer 119. The second electrode pad 540 is formed in the third opening 161 of the transparent electrode layer 119, and thus in electrical contact with the second conductive type semiconductor layer 117. The second electrode 546 is branched from the second electrode pad 540 to form a semiconductor light emitting device 103B as illustrated in FIG. 26.

Figure 25:
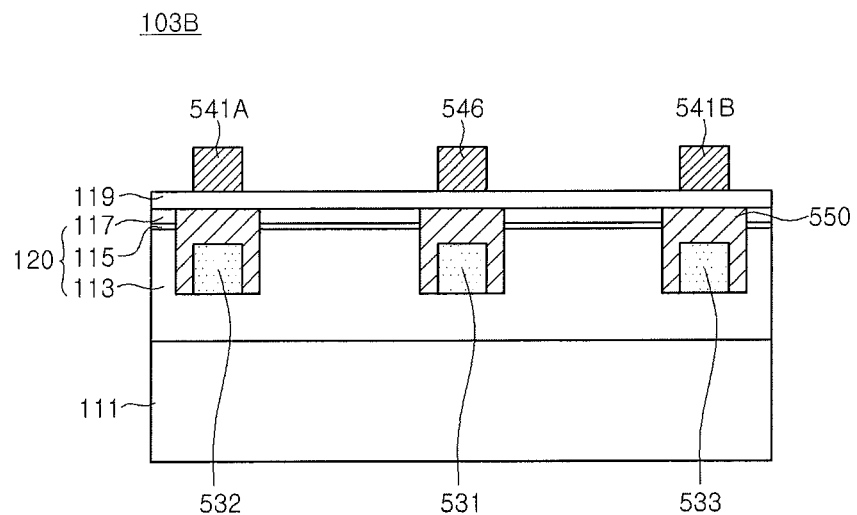
Figure 26:
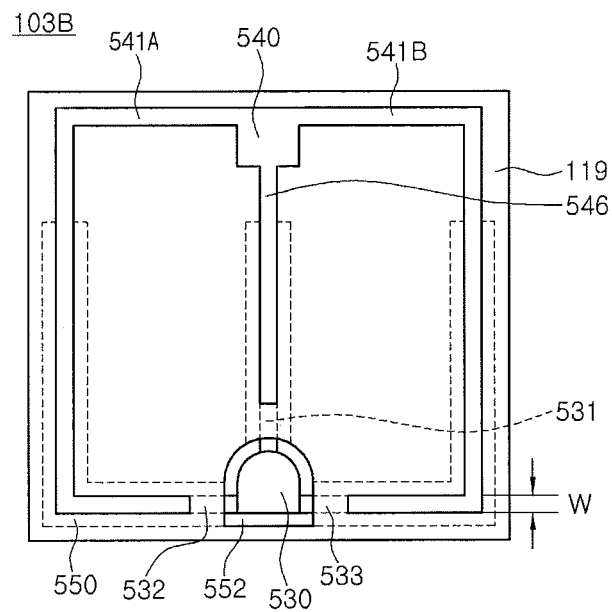

Referring to FIGS. 24 to 26, a part of patterns of first electrodes 531, 532, and 533 spatially overlap a part of patterns of second electrodes 541B, 541B, and 546. Thus, a light emitting area of the semiconductor light emitting device 103B is improved, and the patterns are freely arrayed to improve light emitting efficiency.

FIGS. 27 to 35 are schematic views illustrating a method of manufacturing a semiconductor light emitting device according to another embodiment. Since the current embodiment is partially the same as the above embodiments, a description thereof will be omitted.

Figure 27:
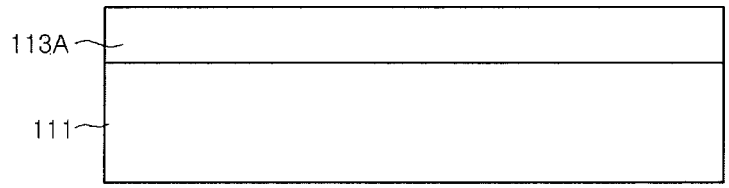
FIGS. 27 to 35 are schematic views illustrating a method of manufacturing a semiconductor light emitting device according to another embodiment.
Figure 28:
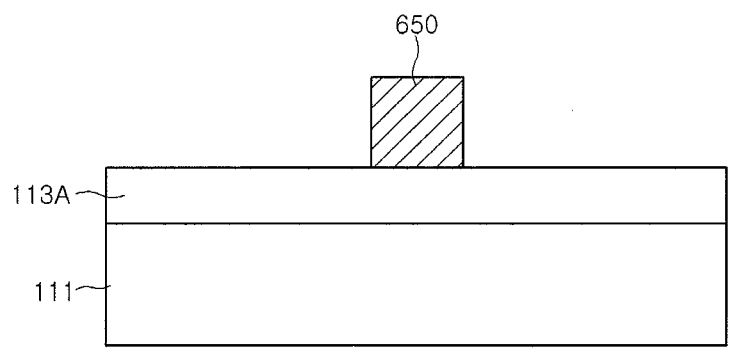
Figure 29:
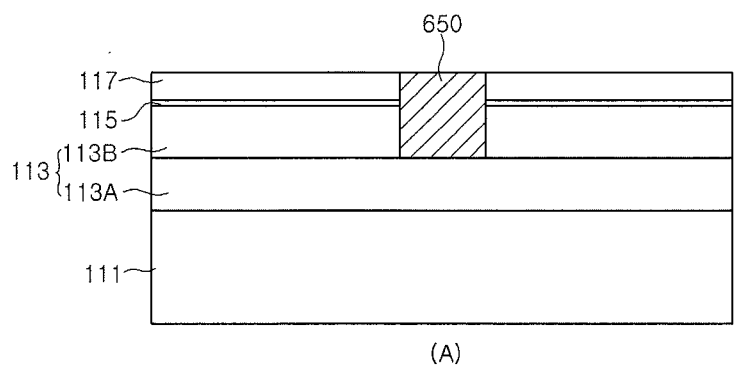
Figure 29:
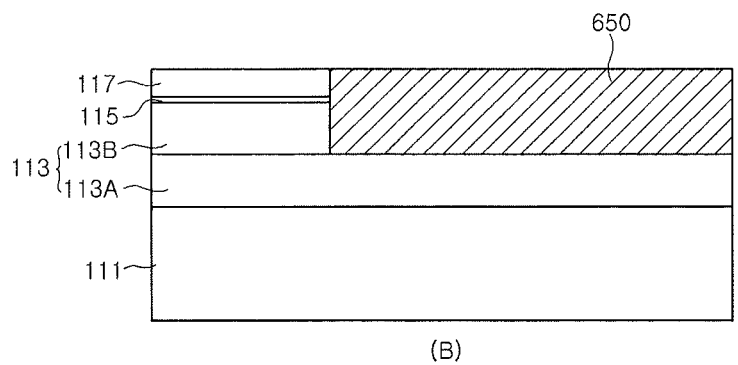

Referring to FIGS. 27 and 28, a first semiconductor layer 113A doped with a first conductive type dopant is formed on the substrate 111. An insulating layer 650 is formed on the first semiconductor layer 113A, and has a shape corresponding to a first electrode pattern, and a width that may be greater than a line width of the first electrode pattern.

FIGS. 29A and 29B are horizontal and vertical cross-sectional views illustrating the device. A second semiconductor layer 113E doped with a first conductive type dopant is formed on the first semiconductor layer 113A. The active layer 115 and the second conductive type semiconductor layer 117 are sequentially formed on the second semiconductor layer 113B. The first conductive type semiconductor layer 113 includes the first semiconductor layer 113A and the second semiconductor layer 113B.

The insulating layer 650 is formed on a side of the first semiconductor layer 113A, and the second semiconductor layer 113B, the active layer 115, and the second conductive type semiconductor layer 117 are formed on another side of the first semiconductor layer 113A.

Figure 30:
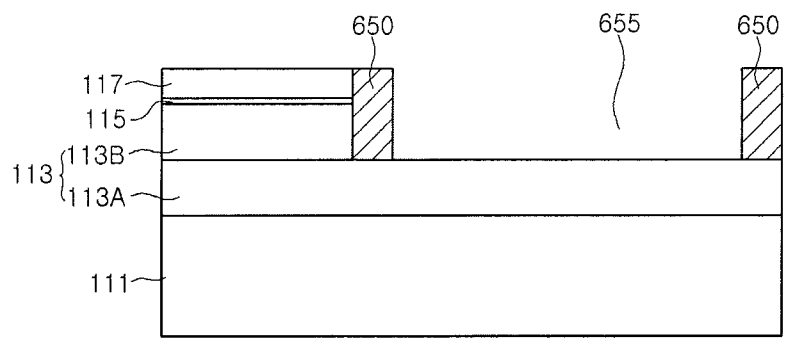
Figure 31:
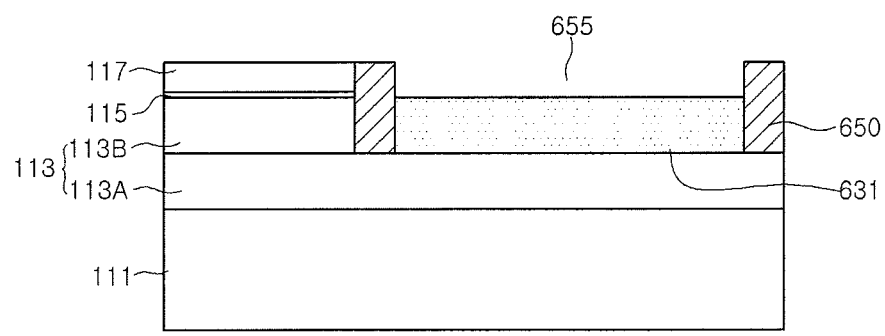

Referring to FIGS. 30 and 31, an inner region (i.e., a first electrode region) of the insulating layer 650 is etched through an etch process to form a sixth opening 655 having a depth to expose the first semiconductor layer 113A. A first electrode 631 having a predetermined thickness is formed in the sixth opening 655. The insulating layer 650 is disposed on outer surfaces of the first electrode 631.

Figure 32:
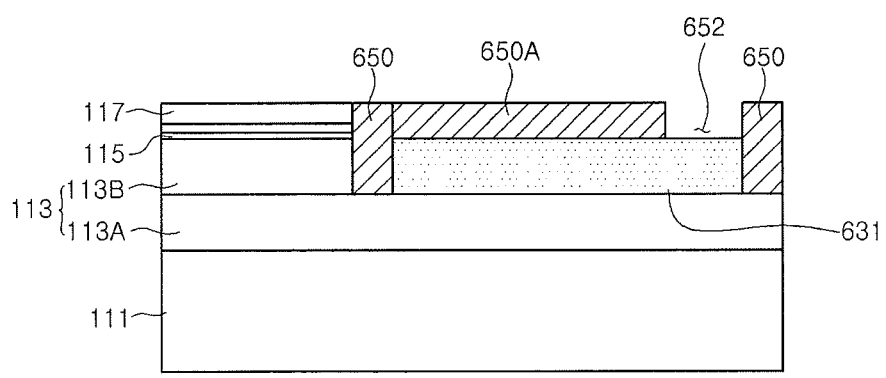

Referring to FIGS. 31 and 32, an insulating layer 650a is formed on the upper surface of the first electrode 631, and a first opening 652 is formed in the insulating layer 650a.

Figure 33:
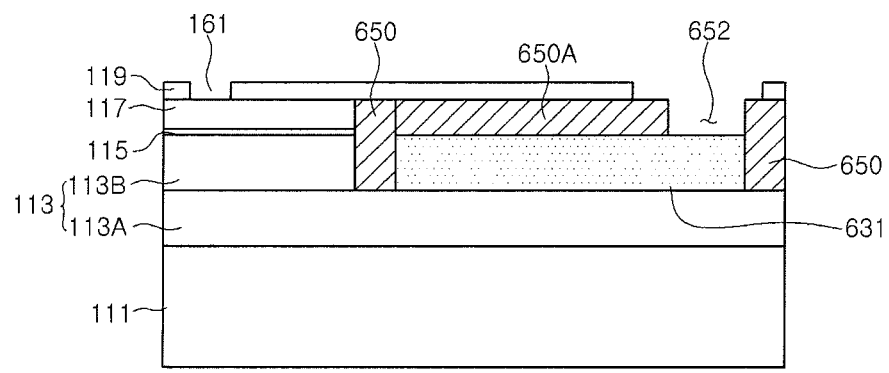
Figure 34:
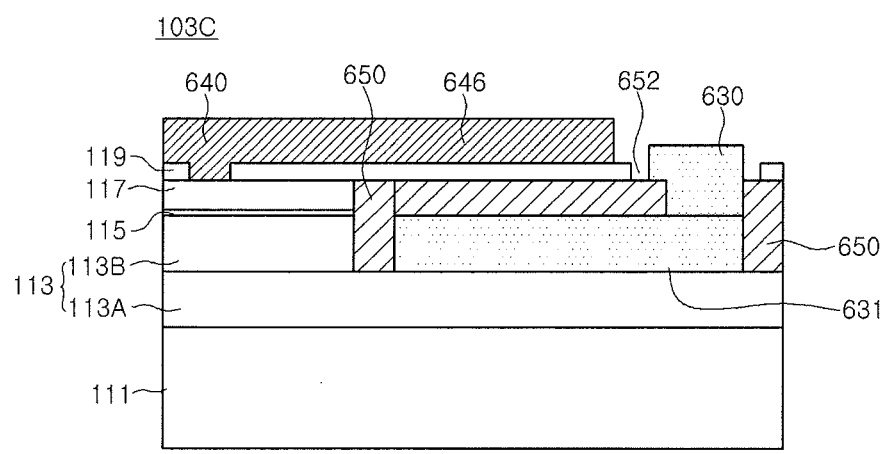

Referring to FIGS. 33 and 34, the transparent electrode layer 1319 are formed on the second conductive type semiconductor layer 117 and the insulating layers 650 and 650A out of the periphery of the first opening 652. The third opening 161 may be formed in a side of the transparent electrode layer 119, or be omitted.

Figure 35:
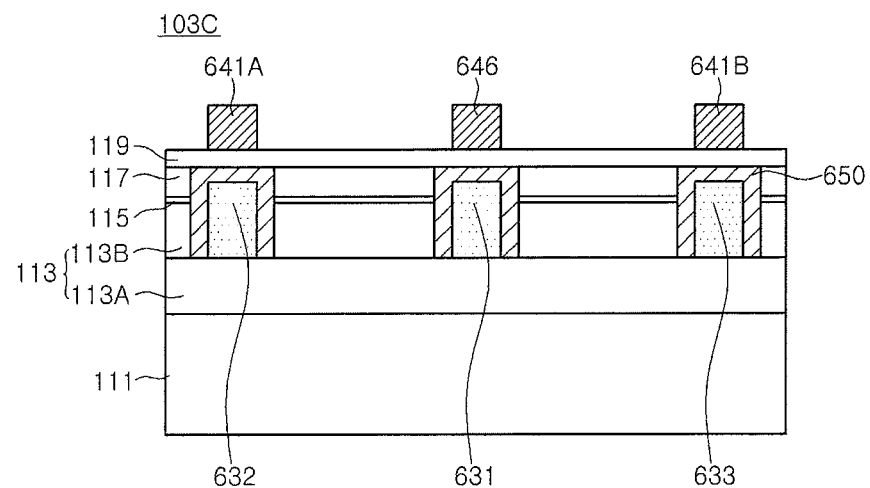

Referring to FIGS. 34 and 35, a second electrode pad 640 and second electrodes 641A, 641B, and 646 are formed on the transparent electrode layer 119. The second electrode pad 640 is in contact with the second conductive type semiconductor layer 117 through the third opening 161 formed in the transparent electrode layer 119. The second electrodes 641A, 641B, and 646 are formed in predetermined patterns on the transparent electrode layer 119, and may be branched from the second electrode pad 640.

The second electrodes 641A, 641B, and 646 constituting a semiconductor light emitting device 103C spatially overlap a part of first electrodes 631, 632, and 633. The second electrode pad 640 may be in direct and/or indirect contact with the second conductive type semiconductor layer 117.

Figure 36:
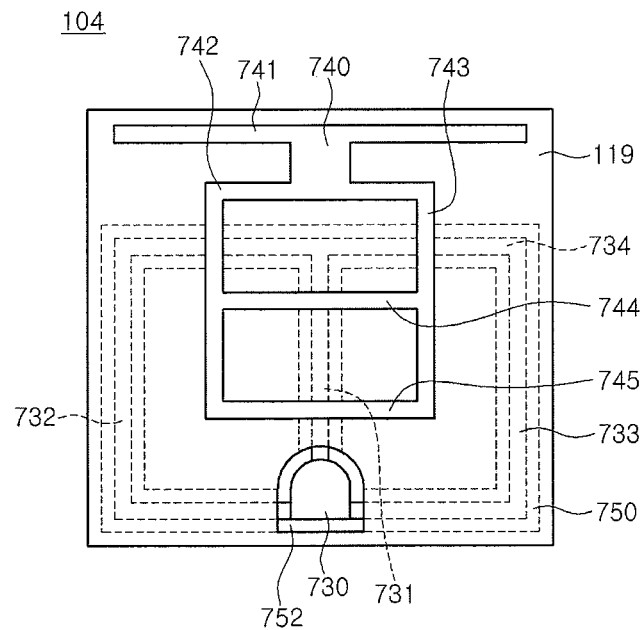
FIG. 36 is a plan view illustrating a semiconductor light emitting device according to another embodiment.

FIG. 36 is a plan view illustrating a semiconductor light emitting device 104 according to an embodiment. Since the current embodiment is partially the same as the above embodiments, a description thereof will be omitted.

Referring to FIG. 36, first electrodes 731, 732, 733, and 734 of the semiconductor light emitting device 104 are classified into a center electrode (also denoted by 731) and side electrodes (also denoted by 732 and 733) that are branched from a first electrode pad 730, and a connecting electrode (also denoted by 734) connecting the first electrodes 731, 732, and 733. Outer surfaces of the first electrodes 731, 732, 733, and 734 are tetragonal.

Accordingly, the center electrode 731 and the connecting electrode 734 partially overlap second electrodes 742, 743, 744, and 745.

Figure 37:
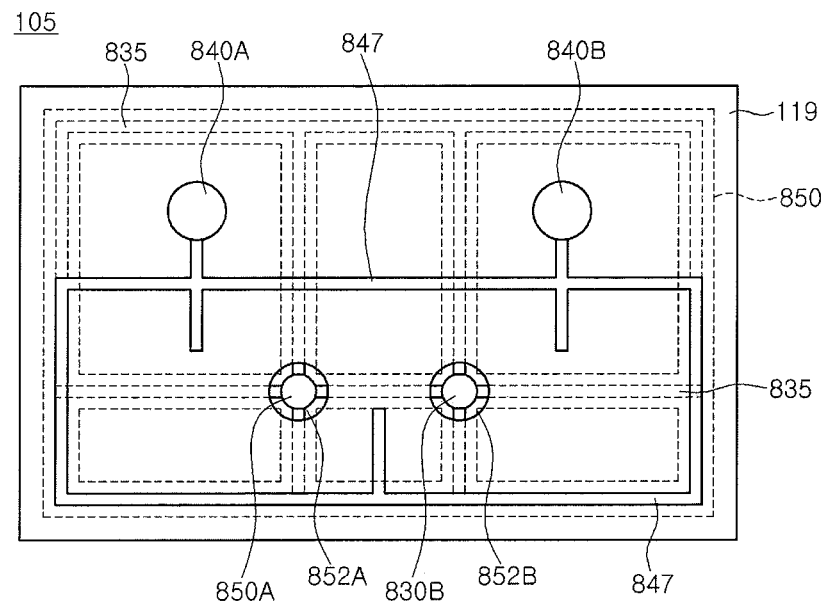
FIG. 37 is a plan view illustrating a semiconductor light emitting device according to another embodiment.

FIG. 37 is a plan view illustrating a semiconductor light emitting device 105 according to an embodiment. Since the current embodiment is partially the same as the above embodiments, a description thereof will be omitted.

Referring to FIG. 37, the semiconductor light emitting device 105 includes a plurality of first electrode pads 830A and 830B, and a plurality of second electrode pads 840A and 840B. A first electrode 835 may have closed loop patterns, e.g. a plurality of tetragonal patterns branched in a plurality of directions from the first electrode pads 830A and 830B. That is, the first electrode 835 may extend along edges of the chip, and extend across the chip, and branches of the first electrode 835 may be connected to each other.

A second electrode 847 may have a cross shape or a T-shape branched from the first electrode pads 830A and 830B, and branches thereof may be connected to each other. The second electrode 847 overlap the upper side of a portion of the first electrode 835, and an overlap region therebetween may be provided with a insulating layer (not shown) and the transparent electrode layer 119.

Figure 38:
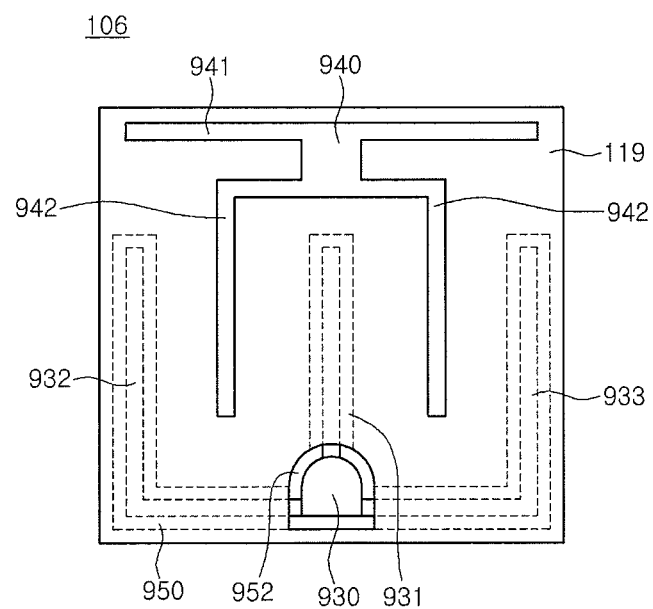
FIG. 38 is a plan view illustrating a semiconductor light emitting device according to another embodiment.

FIG. 38 is a plan view illustrating a semiconductor light emitting device 106 according to an embodiment. Since the current embodiment is partially the same as the above embodiments, a description thereof will be omitted.

Referring to FIG. 38, a first electrode part of the semiconductor light emitting device 106 includes a first electrode pad 930, and first electrodes 931, 932, and 933 branched in a plurality of directions from the first electrode pad 930. A second electrode part includes a second electrode pad 940, and a side second electrode 941 and a center second electrode 942 that are branched in left and right directions from the second electrode pad 940.

The first electrodes 931, 932, and 933 are disposed alternately with the second electrodes 941 and 942, that is, they do not overlap each other, thus preventing concentration of a current and dispersing the current. Since a plane where the first electrodes 931, 932, and 933 are disposed is different from that of the second electrodes 941 and 942, electrode patterns are freely formed. Furthermore, light emitting efficiency and reliability of the semiconductor light emitting device 106 can be improved.

Figure 39:
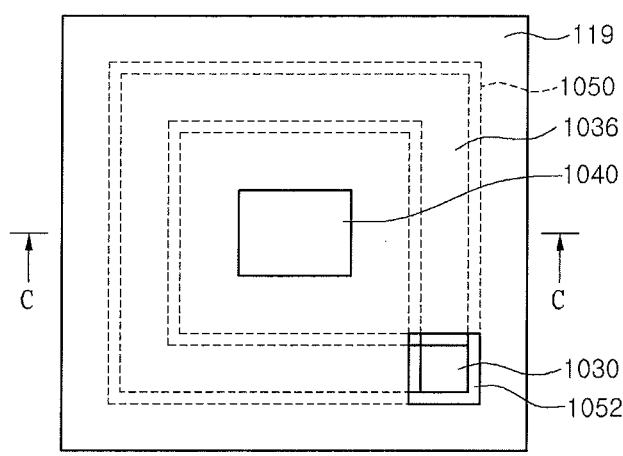
FIG. 39 is a plan view illustrating a semiconductor light emitting device according to another embodiment.
Figure 40:
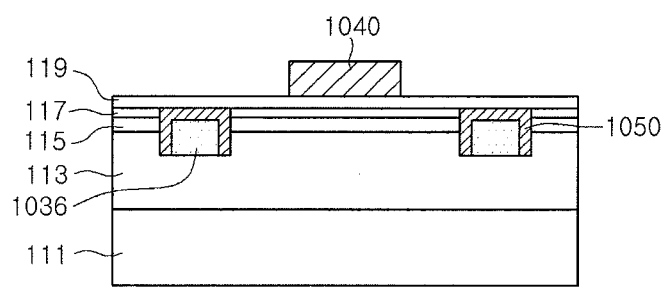
FIG. 40 is a cross-sectional view taken along line C-C of FIG. 39.

FIG. 39 is a plan view illustrating a semiconductor light emitting device 107 according to an embodiment. FIG. 40 is a cross-sectional view taken along line C-C of FIG. 39. Since the current embodiment is partially the same as the above embodiments, a description thereof will be omitted.

Referring to FIGS. 39 and 40, the semiconductor light emitting device 107 includes first electrode parts 1030 and 1036 in a closed loop, and a second electrode pad 1040.

A first electrode (also denoted by 1036) of the first electrode parts 1030 and 1036 is formed in a closed loop. A first electrode pad (also denoted by 1030) may be exposed at one portion of the first electrode 1036, e.g. at a corner thereof. The first electrode 1036 is a closed loop pattern that may be formed on the first conductive type semiconductor layer 113 along a periphery of a chip. The first electrode 1036 has an area that may be less than that of the outermost electrode of the chip, thus improving a light emitting area of the active layer 115.

The second electrode pad 1040 may be formed in a tetragonal pattern at the center of the chip.

Figure 41:
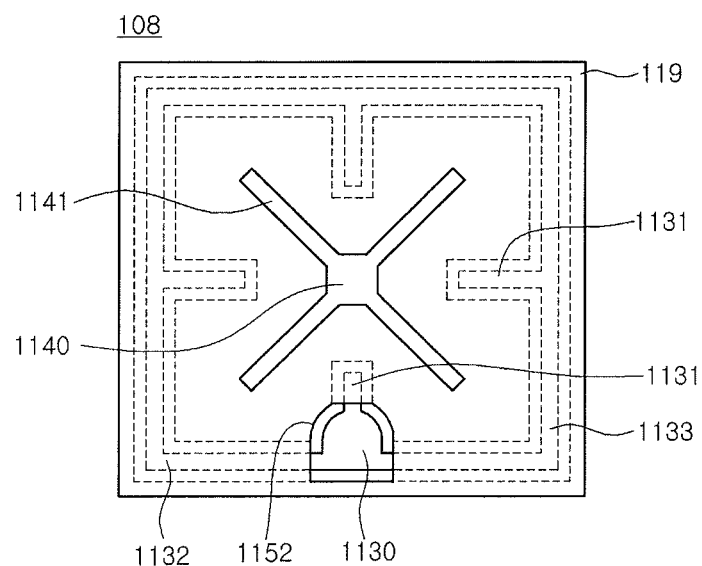
FIG. 41 is a plan view illustrating a semiconductor light emitting device according to another embodiment.

FIG. 41 is a plan view illustrating a semiconductor light emitting device 108 according to an embodiment. Since the current embodiment is partially the same as the above embodiments, a description thereof will be omitted.

Referring to FIG. 41, the semiconductor light emitting device 108 includes a first electrode 1133 disposed along a periphery of a chip, and branch electrodes 1131 extending from the first electrode 1133 to the inside of the chip.

A second electrode pad 1140 and second electrodes 1141 are disposed on the transparent electrode layer 119. The second electrode pad 1140 is disposed at the center of the chip, and the second electrodes 1141 may extend in a radial shape from the second electrode pad 1140, e.g., four electrodes may extend to corners of the chip. In this case, the second electrodes 1141 may be disposed alternately with the branch electrodes 1131 of the first electrode 1133 as illustrated in FIG. 41.

The semiconductor light emitting device 108 uniformly distributes and supplies a current through the first electrode 1133.

Figure 42:
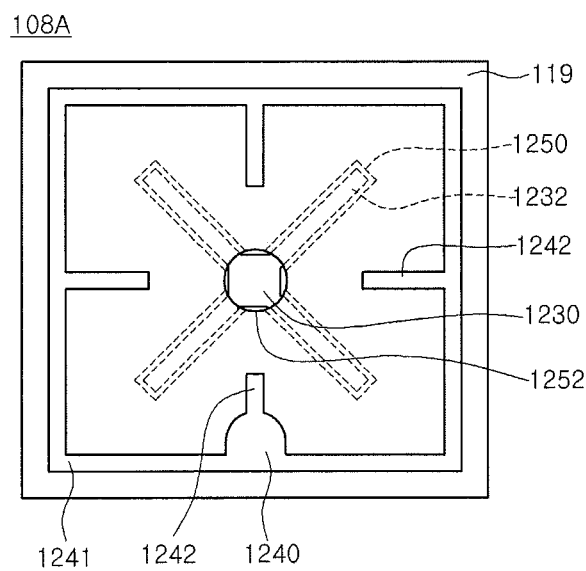
FIG. 42 is a plan view illustrating a semiconductor light emitting device according to another embodiment.

FIG. 42 is a plan view illustrating a semiconductor light emitting device 108A according to an embodiment. Since the current embodiment is partially the same as the above embodiments, a description thereof will be omitted.

Referring to FIG. 42, the semiconductor light emitting device 108A includes a second electrode 1241 disposed along edges on the transparent electrode layer 119, and a plurality of branch electrodes 1242 extending to an inside of a chip from the second electrode 1241. A first electrode pad 1230 is disposed at a center of the chip, and first electrodes 1232 may be branched in a radial direction (to corners of the chip) from the first electrode pad 1230. The branch electrodes 1242 of the second electrode 1241 may be disposed alternately with the first electrodes 1232 as illustrated in FIG. 42. The semiconductor light emitting device 108 increases a light emitting area, and reduces concentration of a current, relative to that of FIG. 42.

Figure 43:
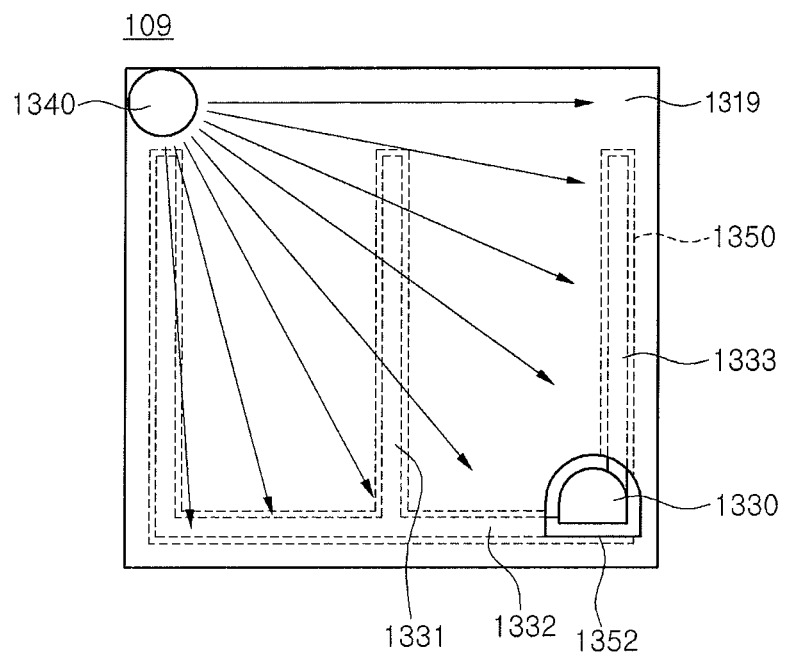
FIG. 43 is a plan view illustrating a semiconductor light emitting device according to another embodiment.

FIG. 43 is a plan view illustrating a semiconductor light emitting device 109 according to an embodiment. Since the current embodiment is partially the same as the above embodiments, a description thereof will be omitted.

Referring to FIG. 43, the semiconductor light emitting device 109 includes first electrodes 1331, 1332, and 1333 having various shapes and disposed on a first conductive type semiconductor layer, and a first electrode pad 1330 disposed at a portion of the first electrodes 1331, 1332, and 1333.

An electrode layer 1319 is disposed on the upper surface of a chip, and has a predetermined thickness in an area except for the first electrode pad 1330. A second electrode pad 1340 is formed in a pattern having a predetermined shape on a side of the electrode layer 1319.

The electrode layer 1319 selectively includes metals such as Al, Ag, Pd, Rh, Pt, Al-based alloy, Ag-based alloy, Pd-based alloy, Rh-based alloy, and Pt-based alloy, but the present disclosure is not limited thereto.

The electrode layer 1319 disperses a current supplied from the second electrode pad 1340 to the entire region. When the electrode layer 1319 is formed of reflective metal, the reflective metal has lower resistance than that of the material of a transparent electrode layer. Thus, the electrode layer 1319 increases a dispersion speed of a current, and provides a high luminance chip. Furthermore, since an additional second electrode is not required, a manufacturing process is improved.

When the semiconductor light emitting device 109 is mounted in a flip chip method, the electrode layer 1319 may reflect light generated from an active layer. Since the first electrodes 1331, 1332, and 1333 are branched in various shapes on the first conductive type semiconductor layer, a current supplied from the first electrode pad 1330 is dispersed and supplied to the entire region of the first conductive type semiconductor layer.

According to the aforementioned embodiments, the semiconductor light emitting device may include a stack structure of the first electrode, the insulating layer, and the transparent electrode, or a stack structure of the first electrode, the insulating layer, the transparent electrode layer, and the second electrode, so that the first and second electrodes disperse a current to the entire region. In addition, a part of patterns of the first electrode may spatially overlap a part of patterns of the second electrode.

According to the embodiments, a light emitting area is improved, and a current is dispersed, thus improving light emitting efficiency. A current is dispersed to obtain a device resistant to electrostatic discharge (ESD). An order in forming of the insulating layer and the first electrode, the depth of mesa etching, and the electrode pattern according to the embodiments may be varied in the scope of the present disclosure, and parts of patterns of the first and second electrodes may overlap each other in at least one region.

Figure 44:
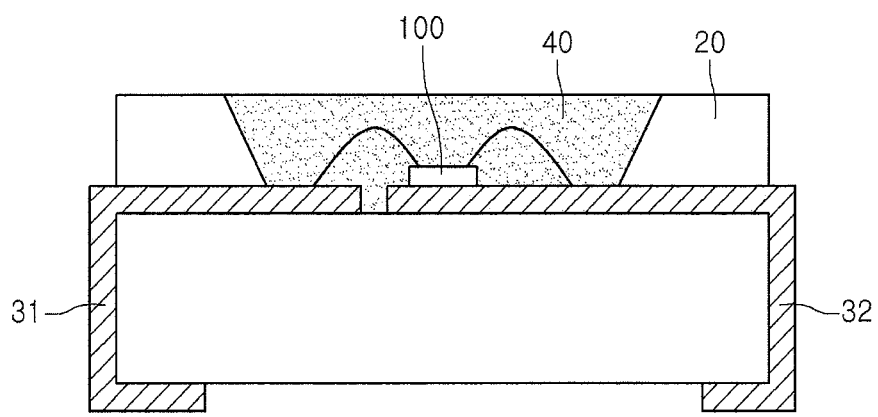
FIG. 44 is a cross-sectional view illustrating a light emitting package according to an embodiment.

FIG. 44 is a cross-sectional view illustrating a light emitting package according to an embodiment.

Referring to FIG. 44, the light emitting package includes a body part 20, first and second lead electrodes 31 and is disposed on the body part 20, the semiconductor light emitting device 100 is disposed on the body part 20 and electrically connected to the first and second lead electrodes 31 and 32, and a molding member 40 surrounding the semiconductor light emitting device 100. The semiconductor light emitting device 100 may be selected from those of the above embodiments.

The body part 20 may include one of silicon, compound resin, and metal. An inclined surface may be disposed around the semiconductor light emitting device 100.

The first and second lead electrodes 31 and 32 are electrically separated from each other, and supply power to the semiconductor light emitting device 100. In addition, the first and second lead electrodes 31 and 32 reflect light generated from the semiconductor light emitting device 100 to increase optical efficiency, and may discharge heat generated from the semiconductor light emitting device 100 to the outside.

The semiconductor light emitting device 100 may be disposed on the body part 20, or on one of the first and second lead electrodes 31 and 32.

The semiconductor light emitting device 100 may be electrically connected to the first and second lead electrodes 31 and 32 through wires, or be mounted in a flip method, but the present disclosure is not limited thereto.

The molding member 40 may surround the semiconductor light emitting device 100 to protect the semiconductor light emitting device 100. The molding member 40 includes a phosphor to vary the wavelength of light emitted from the semiconductor light emitting device 100.

The semiconductor light emitting devices according to the embodiments are packaged in a semiconductor board, a insulating layer board, or a ceramic board formed of resin or silicon, and may be used as light sources of indication apparatuses, illumination apparatuses, and display apparatuses.

An embodiment provides a method of manufacturing a semiconductor light emitting device, the method comprising: forming a first conductive type semiconductor layer; forming an active layer on the first conductive type semiconductor layer; forming a second conductive type semiconductor layer on the active layer; performing a mesa etch process to form a first electrode having a pattern with at least one branch on the first conductive type semiconductor layer; forming a insulating layer on the first electrode; forming an electrode layer on the insulating layer and the second conductive type semiconductor layer; and forming a second electrode part on the electrode layer.

According to the embodiment, a light emitting area is improved.

According to the embodiment, the patterns of the first and second electrodes are freely arrayed.

According to the embodiment, light emitting efficiency is improved.

According to the embodiment, a current is dispersed and supplied to the active layer.

According to the embodiment, the first electrode branched in a branch shape and the second electrode branched on the electrode layer improve current dispersion effect.

The first electrode having a branch shape and the electrode layer improve current dispersion and light reflecting efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a first conductive type semiconductor layer;
an active layer on the first conductive type semiconductor layer;
a second conductive type semiconductor layer on the active layer;
an electrode layer on the second conductive type semiconductor layer;
a first electrode on the first conductive type semiconductor layer; and a second electrode on the second conductive type semiconductor layer and in an opening, the opening being in the electrode layer,
wherein the second electrode has a first portion in the opening and a second portion extending from the first portion and overlapping at least a portion of the first electrode.

2. The light emitting device according to claim 1, wherein the second electrode is disposed on at least a portion of the first conductive type semiconductor layer.

3. The light emitting device according to claim 1, wherein the first portion of the second electrode contacts an inner side surface of the electrode layer in the opening.

4. The light emitting device according to claim 1, wherein the electrode layer surrounds the first portion of the second electrode in the opening.

5. The light emitting device according to claim 1, wherein the second portion of the second electrode contacts at least a portion of a top surface of the electrode layer.

6. The light emitting device according to claim 1, further comprising:
an insulating layer on the first conductive type semiconductor layer.

7. The light emitting device according to claim 6, wherein the insulating layer is between the first electrode and the second portion of the second electrode.

8. The light emitting device according to claim 1, wherein the light insulating layer contacts the electrode layer.

9. A light emitting device, comprising:
a first conductive type semiconductor layer;
an active layer on the first conductive type semiconductor layer;
a second conductive type semiconductor layer on the active layer;
an electrode layer on the second conductive type semiconductor layer;
a first electrode on the first conductive type semiconductor layer; and
a second electrode on the second conductive type semiconductor layer and in a second opening, the second opening being in the electrode layer,
wherein the second electrode has a first bottom surface with a protrusion and a second bottom surface surrounding the first bottom surface, the electrode layer surrounding a side surface of the protrusion in the second opening and the second bottom surface overlapping at least a portion of the electrode layer.

10. The light emitting device according to claim 9, wherein at least a portion of the second electrode overlaps at least a portion the first electrode.

11. The light emitting device according to claim 9, wherein the second electrode is disposed on at least a portion of the first conductive type semiconductor layer.

12. The light emitting device according to claim 1, further comprising:
an insulating layer between the first electrode and the second electrode.

13. The light emitting device according to claim 12, wherein the light insulating layer contacts the electrode layer.

14. The light emitting device according to claim 12, wherein the insulating layer has a first opening, the first electrode upwardly protrudes from the insulating layer through the first opening.

15. A light emitting device, comprising:
a first conductive type semiconductor layer;
an active layer on the first conductive type semiconductor layer;
a second conductive type semiconductor layer on the active layer;
an insulating layer on the first conductive type semiconductor layer;
an electrode layer on the second conductive type semiconductor layer;
a first electrode on the first conductive type semiconductor layer and in a first opening, the first opening being in the insulating layer; and
a second electrode on the second conductive type semiconductor layer and in a second opening, the second opening being in the electrode layer,
wherein the insulating layer overlaps at least a portion of the second electrode,
wherein the second electrode upwardly protrudes from the electrode layer through the second opening and extends toward the first electrode, and
wherein the electrode layer overlaps at least a portion of the second electrode and surrounds a side surface of the second electrode in the second opening.

16. The light emitting device according to claim 15, wherein the first electrode upwardly protrudes from the insulating layer through the first opening.

17. The light emitting device according to claim 15, wherein at least a portion of the second electrode overlaps at least a portion the first electrode.

* * * * *